United States Patent [19]

Ishikawa et al.

[11] Patent Number: 5,430,682
[45] Date of Patent: Jul. 4, 1995

[54] SEMICONDUCTOR INTEGRATED CIRCUIT DEVICE HAVING INTERNAL STEP-DOWN POWER VOLTAGE GENERATOR WITH AUXILIARY CURRENT PATH FOR KEEPING STEP-DOWN POWER VOLTAGE CONSTANT

[75] Inventors: Kimiyasu Ishikawa; Kiyokazu Hashimoto, both of Tokyo, Japan

[73] Assignee: NEC Corporation, Tokyo, Japan

[21] Appl. No.: 184,931

[22] Filed: Jan. 24, 1994

[30] Foreign Application Priority Data

Jan. 22, 1993 [JP] Japan .................... 5-008728

[51] Int. Cl.[6] .............................................. G11C 11/40
[52] U.S. Cl. .................................. 365/226; 365/233.5; 365/230.06; 327/545
[58] Field of Search ............... 365/226, 189.09, 233.5, 365/230.06; 327/540, 541, 544, 545–546, 537, 535

[56] References Cited

U.S. PATENT DOCUMENTS

| | | | |
|---|---|---|---|
| 4,585,955 | 4/1986 | Uchida ............................ | 365/226 |
| 5,023,476 | 6/1991 | Watanabe et al. .............. | 327/540 |

OTHER PUBLICATIONS

Masashi Horiguchi et al., "A Tunable CMOS–DRAM Voltage Limiter with Stabilized Feedback Amplifier", IEEE Journal of Solid-State Circuits, vol. 25, No. 5, Oct. 1990, pp. 1129–1133.

Primary Examiner—Joseph A. Popek
Assistant Examiner—A. Zarabian
Attorney, Agent, or Firm—Sughrue, Mion, Zinn, Macpeak & Seas

[57] ABSTRACT

A word line driver incorporated in a semiconductor memory device is powered by an internal step-down voltage generator for energizing a selected word line, and an address transition detecting circuit causes an n-channel enhancement type switching transistor to temporally turn on between the address transition and completion of a charging operation on the selected word line, thereby preventing the internal step-down power voltage from undesirable decay.

7 Claims, 5 Drawing Sheets

SEMICONDUCTOR INTEGRATED CIRCUIT DEVICE HAVING INTERNAL STEP-DOWN POWER VOLTAGE GENERATOR WITH AUXILIARY CURRENT PATH FOR KEEPING STEP-DOWN POWER VOLTAGE CONSTANT

FIELD OF THE INVENTION

This invention relates to a semiconductor integrated circuit device and, more particularly, to a semiconductor integrated circuit device with an internal step-down voltage generator.

DESCRIPTION OF THE RELATED ART

Ultra-large-scale semiconductor integrated circuit devices such as semiconductor memory devices have progressed in integration density through miniaturization of circuit components, and a step-down power voltage improves the reliability and the electric power consumption of the ultra-large-scale semiconductor integrated circuit devices. However, high-speed component circuits and large power-consuming component circuits are usually incorporated in the ultra-large-scale semiconductor integrated circuit device, and a non-step-down power voltage is desirable for these component circuits. For this reason, an internal step-down voltage generator produces the step-down power voltage, and not only the step-down power voltage but also the non-step-down power voltage are selectively distributed to the component circuits.

FIG. 1 shows a typical example of the internal step-down voltage generator, and the internal step-down voltage generator 1 produces a step-down power voltage Vin from a non-step-down power voltage Vcc. The internal step-down voltage generator 1 distributes the step-down power voltage Vin to component circuits 2.

The step-down voltage generator 1 largely comprises a reference voltage generator 3, a differential amplifier circuit 4, a voltage regulating circuit 5 and a capacitor 6 for preventing the feedback loop, i.e., the combination of the differential amplifier 4 and the voltage regulating circuit 5 from oscillation. The reference voltage generator 3 produces a reference voltage Vref from the non-step-down power voltage Vcc at 5.0 volts, and the reference voltage Vref is regulated to 3.0 volts in this instance.

The differential amplifier circuit 4 is of a current mirror type, and comprises a first series combination of a p-channel enhancement type load transistor Qp1 and an n-channel enhancement type amplifier transistor Qn2 coupled between a non-step-down power voltage line Lvcc and a common node N1, a second series combination of p-channel enhancement type load transistor Qp3 and an n-channel enhancement type amplifier transistor Qn4 coupled in parallel to the first series combination and a constant current source 4a coupled between the common node N1 and a ground voltage line Lgnd.

The gate electrodes of the p-channel enhancement type load transistors Qp1 and Qp3 are connected with the common drain node N2 in the second series combination, and changes the channel resistances depending upon the voltage level at the common drain node N2. The reference voltage Vref is supplied to the gate electrode of the n-channel enhancement type amplifier transistor Qn2, and the step-down power voltage Vin is fed back to the gate electrode of the n-channel enhancement type amplifier transistor Qn4. Therefore, the differential amplifier circuit 4 increases the potential difference between the step-down power voltage Vin and the reference voltage Vref, and produces a control signal CTL at the other common drain node N3 in the first series combination.

If the step-down power voltage Vin exceeds the reference voltage level Vref, the control signal CTL is increased in voltage level in proportion to the differential voltage therebetween. On the other hand, while the step-down power voltage Vin is below the reference voltage level Vref, the voltage level of the control signal CTL is decreased, and the decrement is proportional to the potential difference between the step-down power voltage Vin and the reference voltage level Vref.

The voltage regulating circuit 5 comprises a series combination of a p-channel enhancement type load transistor Qp5 and a depletion type load transistor 5a coupled between the non-step-down power voltage line Lvcc and the ground voltage line Lgnd. The p-channel enhancement type load transistor Qp5 is gated by the control signal CTL, and the channel conductance of the p-channel enhancement type load transistor Qp5 is inversely proportional to the voltage level of the control signal CTL. Therefore, the differential amplifier circuit 4 and the voltage regulating circuit 5 minimizes the potential difference between the step-down power voltage Vin and the reference voltage Vref, and the step-down power voltage Vin at the common drain node N4 is regulated to the reference voltage level Vref.

Another example is disclosed in "A Tunable CMOS-DRAM Voltage Limiter with Stabilized Feedback Amplifier", IEEE Journal of Solid-State Circuits, vol. 25, No. 5, Oct. 1990, pages 1129 to 1135. The feedback amplifier disclosed in the IEEE paper is analogous to the prior art step-down power voltage generator.

Yet another prior art step-down power voltage generator is disclosed in "ULSI DRAM Technologies" published by Science Forum Corporation, pages 91 to 93, and the step-down power voltage generator has a load transistor for producing a step-down voltage lower than a non-step-down voltage by the threshold level thereof. Namely, a reference voltage is supplied to the gate electrode of the load transistor, and the load transistor does not form a feedback loop.

However, the prior art step-down power voltage generator shown in FIG. 1 encounters a problem in that the p-channel enhancement type load transistor Qp5 sets a limit to the power consumption of the component circuits 2. Namely, while the power consumption is varying within the current driving capability of the p-channel enhancement type load transistor Qp5, the internal step-down voltage generator 1 can keep the internal step-down power voltage level Vin constant as indicated by Plots A of FIG. 2. However, if the power consumption exceeds the current driving capability of the p-channel enhancement type load transistor Qp5 between time t1 and time t2, the internal step-down power voltage Vin is decayed as indicated by Plots B. If the variation exceeds the speed of response or the potential difference exceeds the capability of the differential amplifier circuit 4, the prior art internal step-down voltage generator 1 encounters the same problem.

The feedback amplifier disclosed in the IEEE paper also encounters the problem inherent in the prior art internal step-down voltage generator shown in FIG. 1, and the prior art internal step-down voltage generator disclosed in the ULSI DRAM Technologies is more miserable than the prior art shown in FIG. 1.

SUMMARY OF THE INVENTION

It is therefore an important object of the present invention to provide a semiconductor integrated circuit device an internal step-down voltage generator of which is responsive to large and rapid increase in power consumption.

To accomplish the object, the present invention proposes to supplement current through an auxiliary current path when a component circuit requests a large amount of electric power.

In accordance with the present invention, there is provided a semiconductor integrated circuit device comprising: a) at least one component circuit powered with an internal step-down power voltage, an electric power consumption of the at least one component circuit being variable; b) a step-down voltage generator operative to produce the internal step-down power voltage from an external power voltage, and supplying the internal step-down power voltage through an internal step-down power voltage line to the at least one component circuit, the step-down power generator having b-1) a voltage regulating means coupled between a source of the external power voltage and the internal step-down power voltage line, and operative to regulate the internal step-down power voltage to a target level while the electric power consumption is varying within a controllable range thereof, b-2) a monitoring means operative to monitor the at least one component circuit for producing a control signal when the at least one component circuit increases the electric power consumption over the controllable range, and b-3) an auxiliary current supplying means coupled between the source of the external power voltage and the internal step-down power voltage line, and responsive to the control signal for supplying current from the source of the external power voltage to the internal step-down power voltage line when the electric power consumption exceeds the controllable range.

The internal step-down voltage generator may be incorporated in a semiconductor memory device.

BRIEF DESCRIPTION OF THE DRAWINGS

The features and advantages of the semiconductor integrated circuit device according to the present invention will be more clearly understood from the following description taken in conjunction with the accompanying drawings in which.

DESCRIPTION OF THE PREFERRED EMBODIMENTS

First Embodiment

Figure 1:
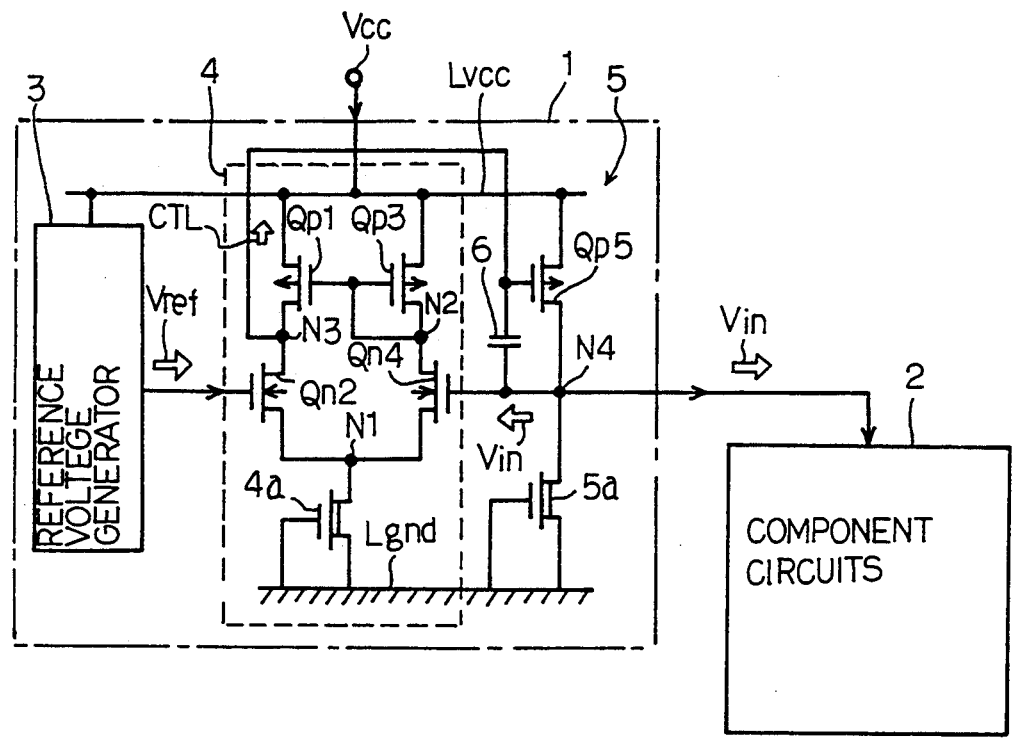
FIG. 1 is a circuit diagram showing the circuit arrangement of the prior art step-down power voltage generator.
Figure 2:
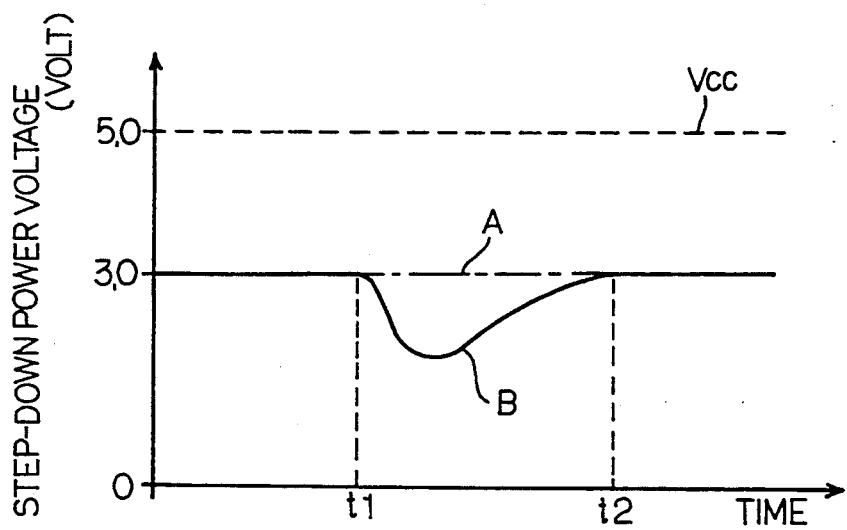
FIG. 2 is a graph showing the voltage level of the internal step-down power voltage produced in the prior art semiconductor integrated circuit device.
Figure 3:
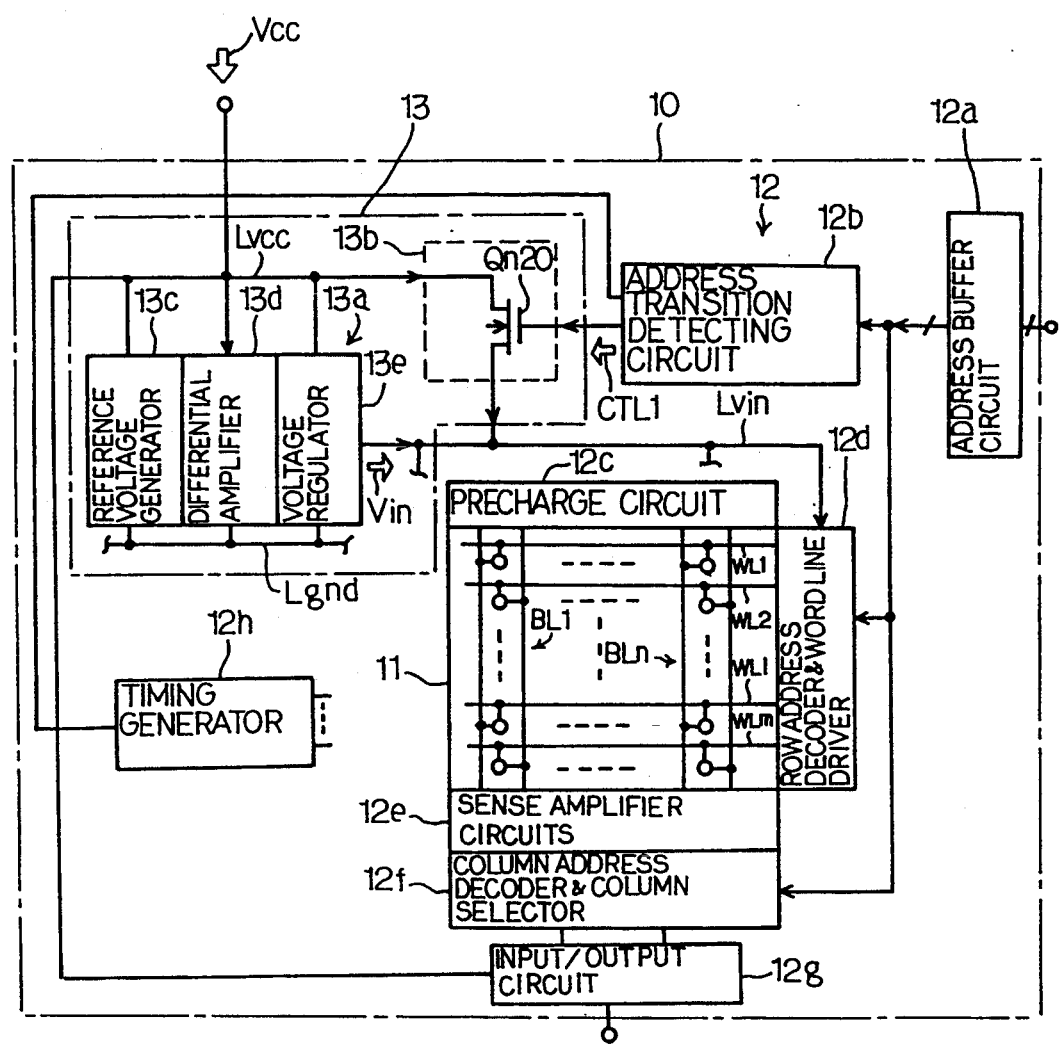
FIG. 3 is a circuit diagram showing the circuit arrangement of a semiconductor memory device according to the present invention.

Referring to FIG. 3 of the drawings, a semiconductor integrated circuit device embodying the present invention is fabricated on a semiconductor chip 10, and largely comprises a memory cell array 11, peripheral circuits 12 and an internal step-down voltage generator 13.

The memory cell array 11 comprises a plurality of memory cells arranged in rows and columns, a plurality of word lines WL1, WL2, ..., WLl and WLm and a plurality of bit line pairs BL1 to BLn. Small circles stand for respective memory cells in FIG. 3. The word lines WL1 to WLm are associated with the rows of memory cells, and each of the word lines WL1 to WLm is coupled with the memory cells of the associated row. The bit line pairs BL1 to BLn are associated with the columns of memory cells, and the memory cells of each column are selectively coupled with the bit lines of the associated pair.

An address buffer circuit 12a, an address transition detecting circuit 12b, a precharge circuit 12c, a row address decoder/word line driver 12d, sense amplifier circuits 12e, a column address decoder/ column selector 12f, an input/output circuit 12g and a timing generator 12h serve as the peripheral circuits 12 by way of example. The cooperation between the memory cell array 11 and the peripheral circuits 12 is well know to a person skilled in the art, and no further description is incorporated hereinbelow for the sake of simplicity. The address transition detecting circuit 12b detects an address transition, and supplies not only one-shot pulse signal to a timing generator 12h as similar to a standard address transition detecting circuit but also a control signal CTL1 to the internal step-down voltage generator 13. While the row address decoder/word line driver 12d is energizing a newly selected word line after the address transition, a large amount of electric power is consumed by the row address decoder/word line driver 12d, and the address transition detecting circuit 12b and the row address decoder/ word line driver 12d respectively serve as a monitoring means and at least one component circuit in this instance. The control signal CTL1 may be output from a flip-flop circuit incorporated in the address transition detecting circuit 12b, and the one-shot pulse signal and a timing control signal from the timing generator may set and reset the flip-flop circuit.

The internal step-down voltage generator 13 comprises a main step-down voltage generating circuit 13a, an auxiliary current supplying circuit 13b and the address transition detecting circuit 12b serving as the monitoring means. The internal step-down voltage generator 13 produces an internal step-down power voltage Vin from the non-step-down power voltage Vcc, and distributes the internal step-down power voltage Vin through a step-down power voltage line Lvin to predetermined component circuits such as, for example, the row address decoder/word line driver 12d.

The main step-down voltage generating circuit 13a comprises a reference voltage generator 13c, a differential amplifier 13d, a voltage regulator 13e and a capacitor (not shown), and the reference voltage generator 13c, the differential amplifier 13d and the voltage regulator 13e are coupled in parallel between a non-step-down power voltage line Lvcc and a ground voltage line Lgnd. The non-step-down power voltage line Lvcc distributes a non-step-down power voltage Vcc to predetermined circuits, and the non-step-down power voltage Vcc is adjusted to 5.0 volts in this instance. The reference voltage generator 13c, the differential amplifier 13d, the voltage regulator 13e and the capacitor are similar in circuit arrangement to the reference voltage generator 3, the differential amplifier circuit 4, the voltage regulating circuit 5 and the capacitor 6, and detailed description is omitted for avoiding repetition.

The auxiliary current supplying circuit 13b is implemented by an n-channel enhancement type switching transistor Qn20 coupled between the non-step-down power voltage line Lvcc and the ground voltage line Lgnd, and the n-channel enhancement type switching transistor Qn20 is gated by the control signal CTL1.

Assuming now that the external address bits supplied to the address buffer circuit 12a changes the selected row address, the address transition detecting circuit 12b produces the one-shot pulse signal, and shifts the control signal CTL1 to active high voltage level. Then, the n-channel enhancement type switching transistor Qn20 turns on, and the n-channel enhancement type switching transistor Qn20 supplies current from the non-step-down power voltage line Lvcc to the step-down power voltage line Lvin. The current driving capability of the n-channel enhancement type switching transistor Qn20 is not so large that the main step-down voltage generating circuit 13a can suppress the internal step-down power voltage Vin around the reference voltage level.

Figure 4:
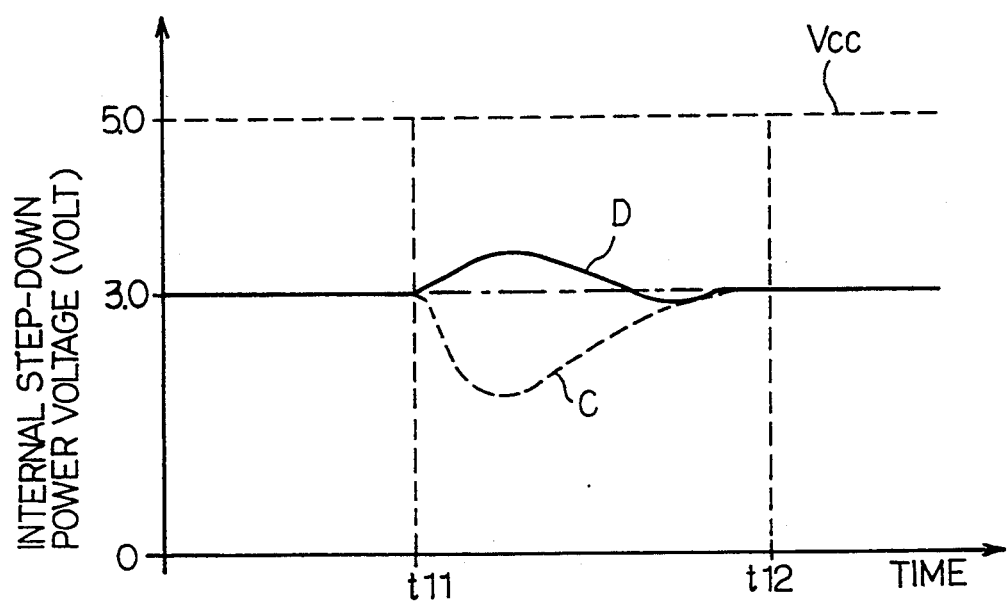
FIG. 4 is a graph showing an internal step-down power voltage consumed in the semiconductor memory device.

With the one-shot pulse signal, the timing generator 12h sequentially produces internal control signals, and the row address decoder/ word line driver 12d starts to energize one of the word lines WL1 to WLm indicated by the external address bits after the address transition at time t11 (see FIG. 4). The row address decoder/ word line driver 12d consumes a large amount of electric power, and tends to lower the internal step-down power voltage Vin as indicated by Plots C. However, the non-step-down power voltage Vcc is directly supplied through the n-channel enhancement type switching transistor Qn20 to the internal step-down power voltage line Lvin, and the internal step-down power voltage line Lvin traces Plots D instead of Plots C.

Upon completion of the charging operation on the newly selected word line at time t12, the control signal CTL1 is recovered from the active high voltage level to inactive low voltage level, and the n-channel enhancement type switching transistor Qn20 turns off. As a result, only the main step-down voltage generating circuit 13a regulates the internal step-down power voltage Vin to the reference voltage level again.

Since the charging operation on the newly selected word line consumes a large amount of electric power, the address transition detecting circuit 12b indirectly detects the increase of the power consumption, and causes the step-down voltage generator 13 to temporally increase the current driving capability.

As will be appreciated from the foregoing description, the step-down voltage generator according to the present invention temporally increases the current driving capability, and prevents the component circuits from malfunction.

Second Embodiment

Figure 5:
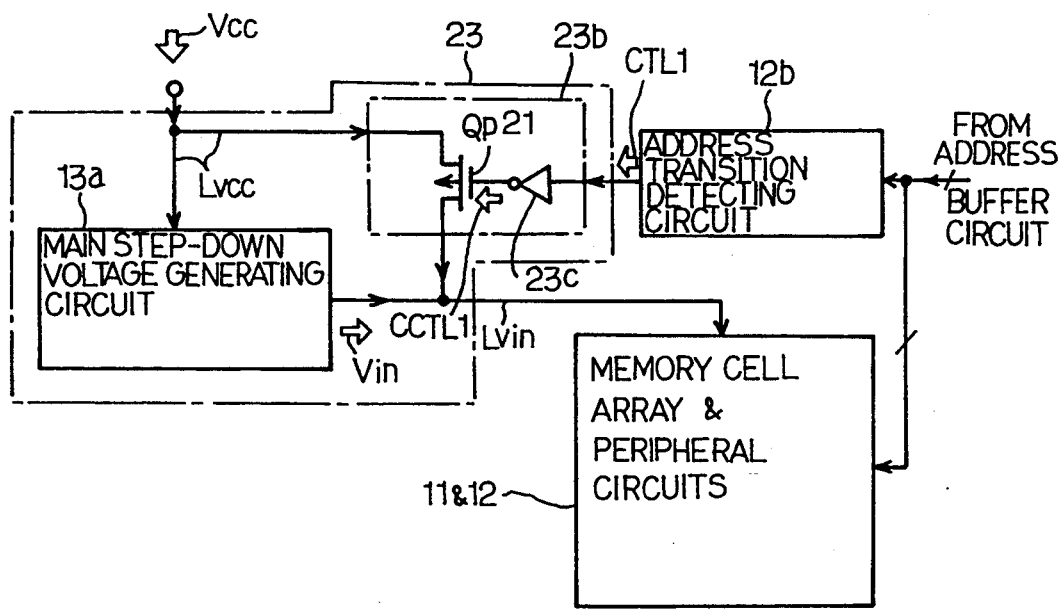
FIG. 5 is a circuit diagram showing the circuit arrangement of another semiconductor memory device according to the present invention.

Turning to FIG. 5 of the drawings, another semiconductor memory device embodying the present invention comprises a memory cell 11, peripheral circuits 12 and an internal step-down voltage generator 23, and the internal step-down voltage generator 23 comprises a main step-down voltage generating circuit 13a, an auxiliary current supplying circuit 23b and an address transition detecting circuit 12b serving as the monitoring means. The memory cell array 11, the peripheral circuits 12, the main step-down voltage generating circuit 13a are similar in arrangement to those of the first embodiment, and, for this reason, they are labeled with the same references.

The auxiliary current supplying circuit 23b comprises a p-channel enhancement type switching transistor Qp21 and an inverter 23c. The control signal CTL1 is supplied to the inverter 23c, and the complementary signal CCTL1 allows the p-channel enhancement type switching transistor to turn on between the address transition and the completion of the charging operation on a newly selected word line.

All of the advantages of the first embodiment are achieved by the internal step-down voltage generator 23.

Third Embodiment

Figure 6:
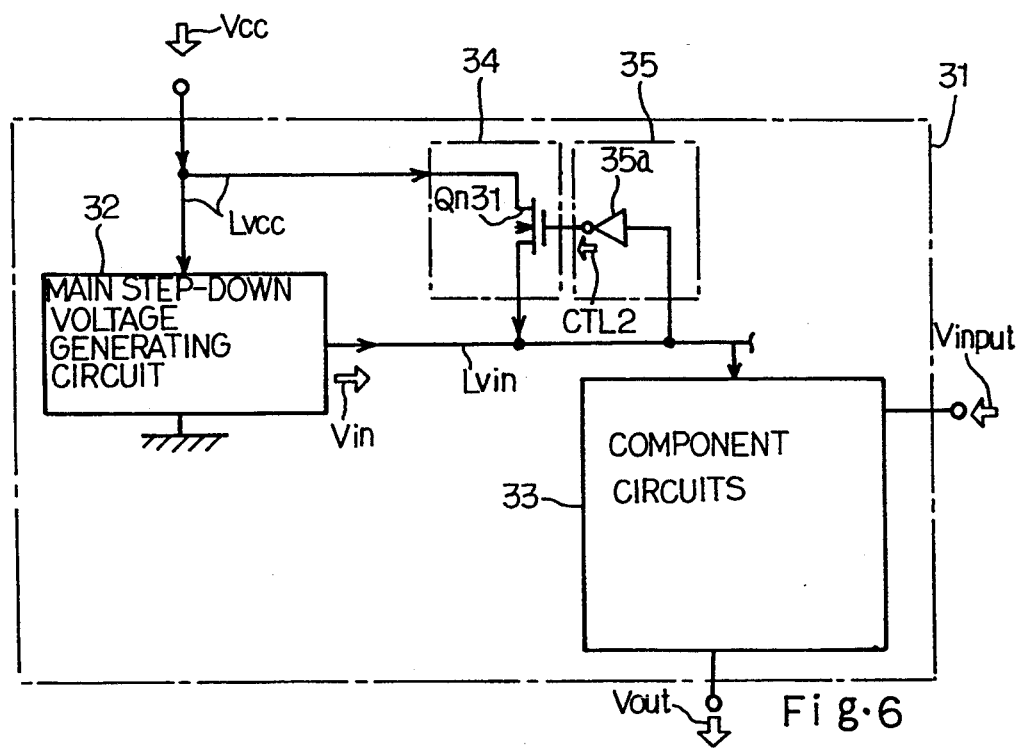
FIG. 6 is a circuit diagram showing the circuit arrangement of a semiconductor integrated circuit device according to the present invention.

Turning to FIG. 6 of the drawings, a semiconductor integrated circuit device is fabricated on a single semiconductor chip 31, and largely comprises a main step-down voltage generating circuit 32, component circuits 33, an auxiliary current supplying circuit 34 and a monitoring circuit 35.

The main step-down voltage generating circuit 32 regulates an internal step-down power voltage Vin to a target level, and powers the component circuits 33 through a step-down power voltage line Lvin for producing an output signal Vout from an input signal Vinput.

The auxiliary current supplying circuit 34 is coupled between a non-step-down power voltage line Lvcc and the step-down power voltage line Lvin, and is implemented by an n-channel enhancement type switching transistor Qn31. The monitoring circuit 35 is an inverter 35a having a threshold slightly lower than the target level, and produces a control signal CTL2 while the internal step-down power voltage Vin is under the threshold level.

While the main step-down voltage generating circuit 32 is keeping the internal step-down power voltage Vin around the target level, the inverter 35 maintains the control signal CTL2 in inactive low voltage level, and the n-channel enhancement type switching transistor Qn31 is turned off. However, if the component circuits 33 temporally increases the electric power consumption over the controllable range of the main step-down voltage generating circuit 32, the internal step-down power voltage Vin goes down below the threshold level of the inverter 35a, and the inverter 35a changes the control signal CTL2 to active high voltage level. Then, the n-channel enhancement type switching transistor Qn31 turns on, and the non-step-down power voltage Vcc recovers the internal step-down power voltage Vin from the undesirable decay.

Thus, the n-channel enhancement type switching transistor Qn31 repeats the turn-on and the turn-off depending upon the voltage level on the internal step-down power voltage line Lvin, and prevents the internal step-down power voltage from undesirable decay.

The internal step-down power generator 23 is applicable to any kind of semiconductor integrated circuit device. If the semiconductor integrated circuit device shown in FIG. 6 is a semiconductor memory device, a voltage decay due to, for example, a multi-bit output data signal is detectable by the monitoring circuit 35.

Fourth Embodiment

Figure 7:
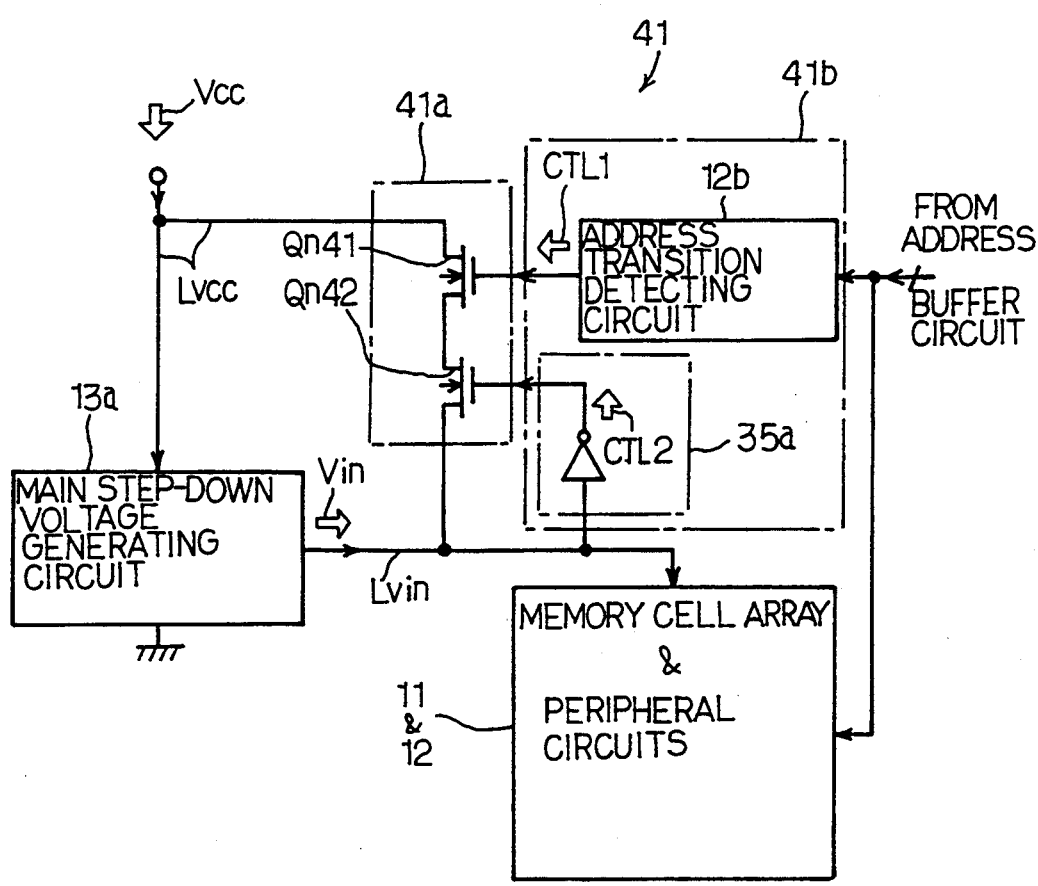
FIG. 7 is a circuit diagram showing the circuit arrangement of yet another semiconductor memory device according to the present invention.

Turning to FIG. 7 of the drawings, yet another semiconductor memory device largely comprises a memory cell array 11, peripheral circuits 12 and a step-down voltage generator 41, and the semiconductor memory device implementing the fourth embodiment is a compromise between the first and third embodiments. The memory cell array 11 and the peripheral circuits 12 are similar to those of the first embodiment, and are labeled with the same references.

The step-down voltage generator 41 comprises a main step-down voltage generating circuit similar to that of the first embodiment, an auxiliary current supplying circuit 41a coupled between the non-step-down power voltage line Lvcc and the internal step-down power voltage line Lvin and a monitoring circuit 41b. The auxiliary current supplying circuit 41a is implemented by a series combination of n-channel enhancement type switching transistors Qn41 and Qn42, and the monitoring circuit 41b has an address transition detecting circuit 12b and an inverter 35a. The address transition detecting circuit 12b and the inverter 35a are similar to those of the first and third embodiments, and supply the control signals CTL1 and CTL2 to the gate electrode of the n-channel enhancement type switching transistor Qn41 and the gate electrode of the n-channel enhancement type switching transistor Qn42, respectively.

The step-down voltage generator 41 supplies the current to the internal step-down power voltage line Lvin only when the internal step-down power voltage is decayed after the address transition.

Although the auxiliary current supplying circuit 41a is implemented by the n-channel enhancement type switching transistors Qn41 and Qn42 coupled in series, the n-channel enhancement type switching transistors Qn41 and Qn42 may be coupled in parallel between the non-step-down power voltage line Lvcc and the internal step-down power voltage line Lvin, and is desirable for a semiconductor memory device where the address transition makes the internal step-down power voltage Vin widely decayed.

Although particular embodiments of the present invention have been shown and described, it will be obvious to those skilled in the art that various changes and modifications may be made without departing from the spirit and scope of the present invention. A field effect transistor directly controlled by a reference voltage level may implement a main step-down voltage generating circuit, and the present invention is applicable to any kind of semiconductor integrated circuit device with an internal step-down voltage generator.

What is claimed is:

1. A semiconductor integrated circuit device comprising:
   a) at least one component circuit powered with an internal step-down power voltage, an electric power consumption of said at least one component circuit being variable; b) a step-down voltage generator operative to produce said internal step-down power voltage from an external power voltage, and supplying said internal step-down power voltage through an internal step-down power voltage line to said at least one component circuit, said step-down power generator having
   b-1 a voltage regulating means coupled between a source of said external power voltage and said internal step-down power voltage line, and operative to regulate said internal step-down power voltage to a target level while said electric power consumption is varying within a controllable range thereof,
   b-2 a monitoring means operative to monitor said at least one component circuit for producing a control signal when said at least one component circuit increases said electric power consumption over said controllable range, and
   b-3 an auxiliary current supplying means coupled between said source of said external power voltage and said internal step-down power voltage line, and responsive to said control signal for supplying current from said source of said external power voltage to said internal step-down power voltage line when said electric power consumption exceeds said controllable range.

2. The semiconductor integrated circuit device as set forth in claim 1, in which said semiconductor integrated circuit device serves as a semiconductor memory device, and comprises a word line driver serving as said at least one component circuit and an address transition detecting circuit serving as said monitoring means.

3. The semiconductor integrated circuit device as set forth in claim 2, in which said auxiliary current supply means is implemented by a switching transistor gated by said control signal, said address transition detecting circuit changing said control signal to an active level between an address transition of address bits and completion of charging operation on a newly selected word line indicated by said address bits after said address transition.

4. The semiconductor integrated circuit device as set forth in claim 3, in which said switching transistor is an n-channel enhancement type field effect transistor, and said active level of said control signal is a high voltage level for allowing said n-channel enhancement type switching transistor to turn on.

5. The semiconductor integrated circuit device as set forth in claim 3, in which said switching transistor is a p-channel enhancement type field effect transistor, and said control signal is supplied through an inverter to the gate electrode of said p-channel enhancement type field effect transistor.

6. The semiconductor integrated circuit device as set forth in claim 1, in which said monitoring circuit is implemented by an inverter coupled at an input node thereof with said internal step-down power voltage line, and said auxiliary current supplying means is implemented by a transistor coupled between said source of external power voltage and said internal step-down power voltage line.

7. The semiconductor integrated circuit device as set forth in claim 1, in which said semiconductor integrated circuit device serves as a semiconductor memory device, and said monitoring means comprises an address transition detecting circuit for producing a first control signal at an address transition and an inverter connected at an input node thereof with said internal step-down power voltage line with a threshold level around said target level for producing a second control signal when said internal step-down voltage becomes lower than said threshold, said auxiliary current supplying means comprising a series combination of a first switching transistor gated by said first control signal and a second switching transistor gated by said second control signal, said first and second control signals serving as said control signal.

* * * * *